United States Patent [19]

Wensink

[11] 4,384,917
[45] May 24, 1983

[54] JET ETCH METHOD FOR DECAPSULATION OF MOLDED DEVICES

[76] Inventor: Ben L. Wensink, 1236 Lisa La., Los Altos, Calif. 94022

[21] Appl. No.: 357,774

[22] Filed: Mar. 12, 1982

Related U.S. Application Data

[62] Division of Ser. No. 192,076, Sep. 29, 1980, Pat. No. 4,344,809.

[51] Int. Cl.³ .................. B29C 17/08; C03C 15/00; C03C 25/06; B44C 1/22
[52] U.S. Cl. ..................... 156/627; 29/575; 156/640
[58] Field of Search ............ 156/626, 627, 638, 640, 156/642, 655, 668, 345; 29/575; 134/3, 10, 19, 21, 34, 103, 108, 198; 204/129.2, 129.6

[56] References Cited

U.S. PATENT DOCUMENTS

| | | | |
|---|---|---|---|
| 3,112,554 | 12/1963 | Teszner | 156/627 X |
| 3,947,952 | 4/1976 | Miller et al. | 156/668 X |
| 3,969,813 | 7/1976 | Minetti et al. | 29/575 |
| 4,089,704 | 5/1978 | Heiss et al. | 156/668 X |

FOREIGN PATENT DOCUMENTS 2455363  6/1976  Fed. Rep. of Germany ...... 156/640

Primary Examiner—William A. Powell
Attorney, Agent, or Firm—Thomas E. Schatzel

[57] ABSTRACT

A jet etch apparatus and method for decapsulation of molded devices having an etching block through which an etchant solution is drawn. The etchant solution which flows through the etching block forms a jet spray that impinges upon a device to be decapsulated. The etchant solution is drawn through the etching block by means of suction created by a jet pump. The decapsulation process is monitored by detecting current flow between an electrode in the etchant solution and the device. The imposed current also serves to limit excessive oxidation of aluminum pads within the device, thereby preventing attack of the aluminum by the etchant.

8 Claims, 6 Drawing Figures

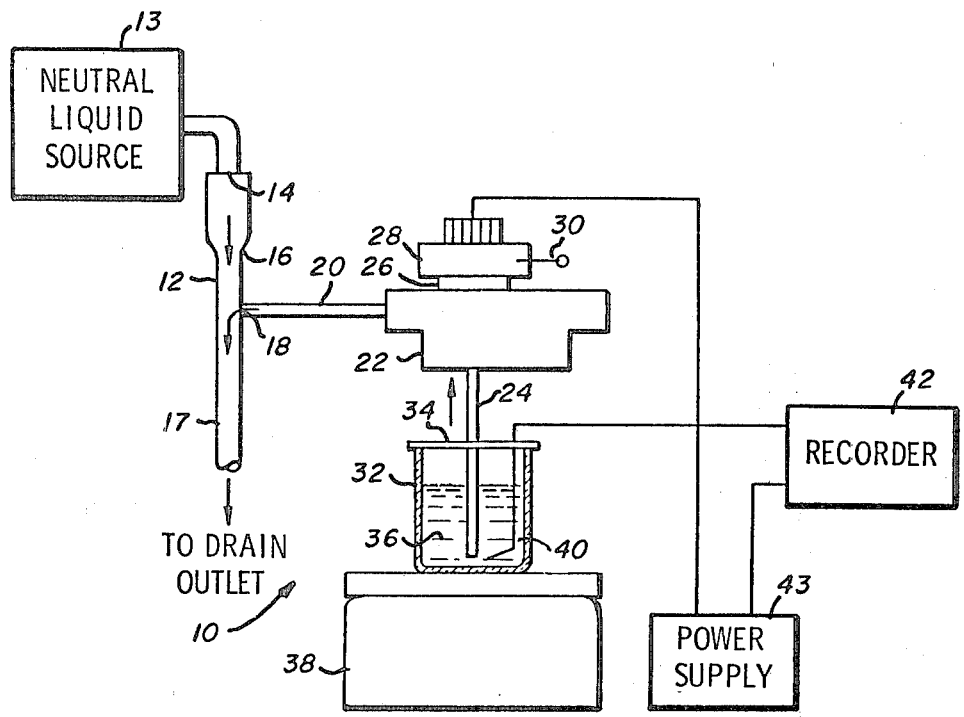
Fig_1
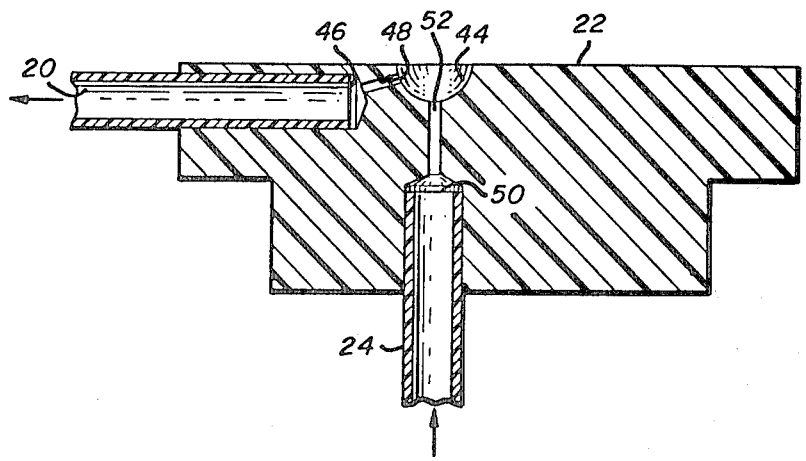
Fig_2

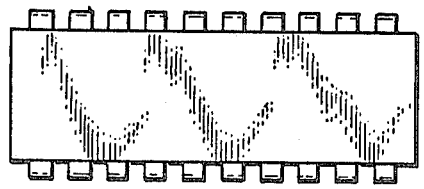
Fig_3A
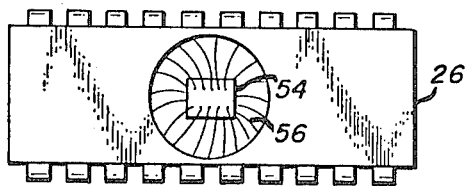
Fig_3B
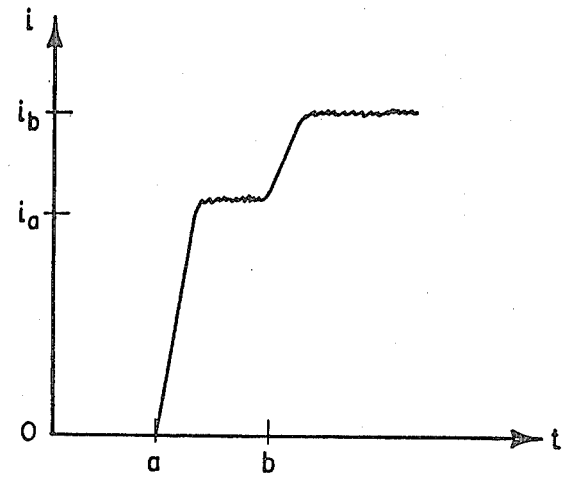
Fig_4
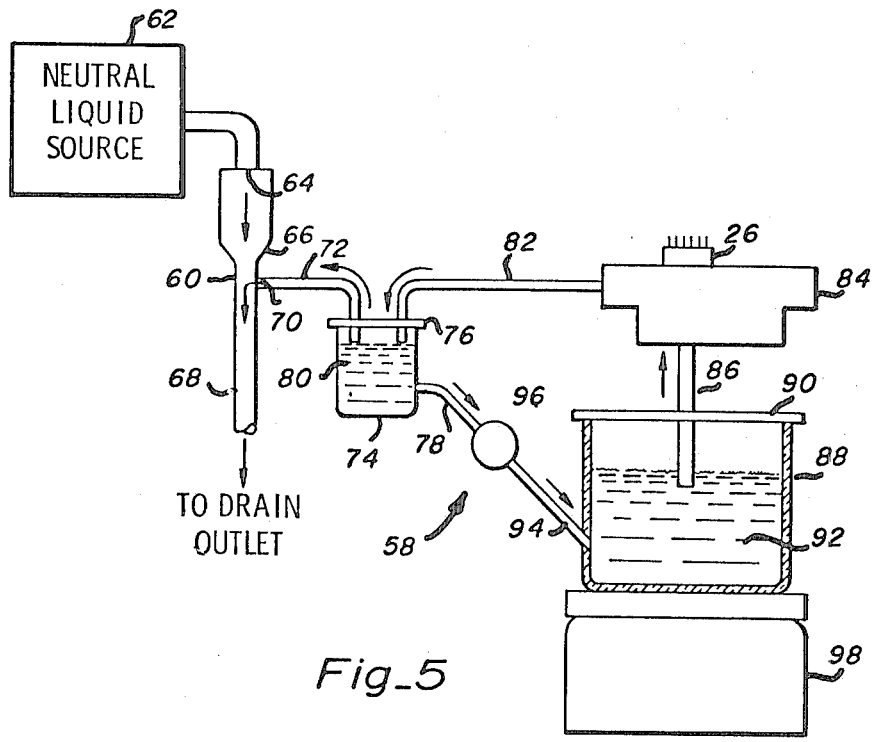
Fig_5

JET ETCH METHOD FOR DECAPSULATION OF MOLDED DEVICES

This is a division of application Ser. No. 06/192,076, filed Sept. 29, 1980, now U.S. Pat. No. 4,344,809.

BACKGROUND OF THE INVENTION

1. Field of the Invention

The invention relates generally to the localized application of etching or solvent liquids for thinning or removal of material or layers of material such as required for the decapsulation of molded devices and microcircuits and more particularly to an apparatus and process for decapsulation of devices wherein the device is unattacked and very clean so that it is highly suitable for internal visual inspection such as during routine destructive physical analysis or failure analysis.

2. Description of the Prior Art

Semiconductor devices are commonly encapsulated with a plastic molding compound. Epoxy is the most commonly used plastic molding compound for encapsulating semiconductor devices. Recent improvements in the techniques for epoxy encapsulation of semiconductor devices have made this method a serious competitor of the more costly hermetic sealed packages for semiconductors.

However, a disadvantage of epoxy encapsulation is that internal visual inspection of the encapsulated device is extremely difficult once the chip has been molded in plastic. However, internal inspection is commonly required of a sample device from a deliverable lot for quality and workmanship assessment and for failure analysis of failed devices. Internal inspection of epoxy encapsulated devices is not possible unless the epoxy which covers the chip and bonding wires is removed. The so-called decapsulation should, of course, not destroy the chip and bonding system and subsequent electrical testing must remain possible.

In the prior art, various methods are employed for decapsulation of epoxy-packaged devices. The most commonly used solvents are hot concentrated acids such as sulfuric acid and nitric acid. Commercially available solvents of a proprietary composition are sometimes useful for certain types of epoxy and the plastic can also be ashed in an oxygen plasma. However, all of these methods have their own specific disadvantages; some cause considerable damage to the package and others may take a very long time to uncover the chip.

When an epoxy-packaged integrated circuit is dissolved by immersion in hot sulfuric acid, rapid contamination of the acid will occur, resulting in difficulty of removing the decapsulation debris from the chip afterwards. Where routine decapsulation of samples is being done, this means that frequent replacement of the etchant and large quantities of hot acid are required, which from a safety point of view is rather undesirable. In practice, this method is therefore feasible only on a small scale, e.g. for occasional failure analysis. Complete immersion also often causes severe damage to the package which can make further electrical testing impossible.

Another disadvantage of liquid solvents is that unless the decapsulation progress is closely monitored and the time involved kept to a minimum, there is a risk of damage to chip metalization or to the bonding system. This is especially unsuitable since the two most frequently reported defects in epoxy-packaged semiconductor devices are corrosion of chip metalization and hot intermittent opens of the bonding wires.

A jet-etch technique is discussed in an article entitled "Jet-Etching Plastic Encapsulations," published by Electrical Quality Assurance Directorate, Procurement Executive, Ministry of Defense, "Aquila," Bromley, Kent, BR1 2JB. This article describes a decapsulation method where hot sulfuric acid is forced from a pressurized stainless steel container through a nozzle and sprays the package which is clamped on top of the container, thus producing a hole towards the silicon chip. However, this method results in rapid contamination of the acid due to the use of stainless steel for the container and the necessary overpressure and dispose of used etchant and debris form a potential safety hazard. Moreover, a clamping system is required to keep the package in place.

SUMMARY OF THE PRESENT INVENTION

It is therefore an object of the present invention to provide a method and apparatus for the localized application of etchants or solvents for the thinning or removal of material or layers of material such as required for the decapsulation of molded semiconductor devices which is non-destructive of the semiconductor chip and bonding system.

It is a further object to provide an economical apparatus and method for decapsulation of epoxy-packaged semiconductor devices which is both rapid and safe.

It is a further object to provide an improved method and apparatus for decapsulation of molded semiconductor devices which permits easy electrical testing after decapsulation.

It is a further object to provide an apparatus for decapsulation of molded semi-conductor devices which does not require clamping of the device during decapsulation.

It is a further object to dispose of used etchant and debris safely.

Briefly, a preferred embodiment of the present invention includes a jet pump or aspirator connected by a tube to an etching block. The etching block is further connected by a tube to a container for holding an etchant solution. The semiconductor device is placed on top of the etching block and as fluid flows through the jet pump, a suction is created drawing the etchant solution through the etching block and a hole is etched in the encapsulating material surrounding the semiconductor device.

An advantage of the apparatus and method for decapsulation of molded semiconductor devices of the present invention is that the semiconductor chip and bonding system of the chip are not damaged by the decapsulation.

Another advantage is that decapsulation may be accomplished rapidly and safely.

A further advantage is that electrical testing after decapsulation of the semiconductor device may be easily carried out.

A further advantage is that clamping of the device is not required during decapsulation.

A further advantage is that disposal of used etchant and debris can be accomplished safely.

These and other objects and advantages of the present invention will no doubt become obvious to those of ordinary skill in the art after having read the following detailed description of the preferred embodiment which is illustrated in the various drawing figures.

IN THE DRAWING

FIG. 1 is a side view of a decapsulation apparatus in accordance with the present invention as set-up for decapsulating a molded semiconductor device;

FIG. 2 is an enlarged cross-sectional side view of the etching block of FIG. 1;

FIG. 3A is a top view of an encapsulated semiconductor device prior to decapsulation;

FIG. 3B is a top view of a semiconductor device subsequent to decapsulation by the decapsulation apparatus of FIG. 1; and FIG. 4 is a time versus current graph illustrating the electrical current flowing through the semiconductor device during the decapsulation process.

FIG. 5 is a side view of an alternative embodiment of a decapsulation apparatus in accordance with the present invention as set-up for decapsulating a molded semiconductor device.

DETAILED DESCRIPTION OF THE PREFERRED EMBODIMENT

FIG. 1 illustrates a decapsulation apparatus in accordance with the present invention and referred to by the general reference numeral 10. The decapsulation apparatus 10 includes a jet pump 12 connected to a source of neutral liquid, e.g. water 13. The jet pump 12 includes an inlet portal 14, a tapered constriction 16 in the flow path and an elongated extension 17. The extension 17 may extend to a drain or other disposal outlet. A portal 18 is located along the narrow portion of the flow path. The portal 18 has a diameter less than the diameter of a cross section of the flow path at the point where the portal 18 is located. A tube 20 is connected to the jet pump 12 at the portal 18. The tube 20 is connected to an etching block 22. Also connected to the etching block 22 is a tube 24. In the preferred embodiment the tube 20, the etching block 22 and the tube 24 are made of polytetrafluoroethylene, a material which is not subject to attack by an etchant solution. However, other inert materials may be used depending on the etchant or solvent used.

An encapsulated semiconductor device 26 to be decapsulated, is inserted into an adjustable electrical insertion socket for receiving and releasing the device 26. A lever 30 is engaged to the socket 28 to control the adjustment of the socket so as to allow insertion and release of the device 26. When the lever 30 is raised so as to open the socket 28, the semiconductor device 26 may be easily inserted into the socket 28. Once inserted, the lever 30 is lowered and the semiconductor 26 is firmly clamped into place in the socket 28. The socket is also connected to electrical wiring so that the encapsulated chip may be electrically excited while in position about the top side of the block 22.

The tube 24 extends from the block 22 to a vessel 32. The vessel 32 includes a cover 34 and contains an etchant solution 36, which in the preferred embodiment comprises sulfuric acid. The vessel 32 should not be airtight in order that atmospheric pressure may be maintained inside the vessel 32. The tube 24 is inserted in the vessel 32 such that the lower opening of the tube 24 is below the level of the etchant solution 36 so that solution 36 may be drawn through the tube 24. Located below the vessel 32 is a hot plate 38.

An electrode 40 is placed in the etchant solution 36 and electrically connected to a recorder 42 which is also electrically connected to a power supply 43 which is also connected to the electrical socket 28. Thus, the device 26 is electrically connected in the circuit when in the socket 28.

FIG. 2 is an enlarged cross-sectional view of the etching block 22. Located at the top of the etching block 22 is an etching cup 44 of generally concave hemispherical shape. The tube 20 is inserted into a bore 46 in the etching block 22. The bore 46 is connected to the etching cup 44 by a portal 48 having a diameter less than the diameter of the bore 46 and tube 20. The tube 24 is inserted into a bore 50 in the etching block 22. The bore 50 is connected to the etching cup 44 by a portal 52 having a diameter less than that of the bore 50 and tube 24. The axes of the bore 50, portal 52 and recess 44 are coaxial. Thus, the solution 36 entering the recess 44, does so at the center of the recess.

FIG. 3A is a top view of the encapsulated semiconductor device 26 prior to decapsulation by the decapsulation apparatus 10. FIG. 3B is a top view of the semiconductor device 26 subsequent to decapsulation by the decapsulation apparatus 10. A silicon chip 54 and bonding wires 56 are exposed after the epoxy-packaging surrounding them has been etched away. Thus, the decapsulation is partial to the degree necessary to visually expose the encapsulated semiconductor chip and its electrical connection system.

The operation of the decapsulation apparatus 10 is believed to be as follows. The etchant solution 36 is heated to approximately 275° C. by means of the hot plate 38. The device to be decapsulated, e.g. semiconductor device 26 is preferably baked at approximately 100° C. for approximately one hour, then inserted in the socket 28, and then placed over the etching cap 44 such that the encapsulated silicon chip 54 is centered above the etching cup 44 and completely covers the top opening of the cup 44. The jet pump 12 is activated and when water flows through the jet pump 12, a low pressure zone is created at the portal 18. This low pressure zone creates a suction in the cup 44 which tends to draw the heated etchant solution 36 from the vat 32 through the tube 24, through the bore 50, through the portal 52 and into the etching cup 44. The etchant solution 36 drawn into the etching cup 44 sprays the surface of the semiconductor device 26 and thereby etches away the epoxy encapsulation material. The suction created by the jet pump retains the semiconductor device 26 in position. The etchant solution 36 and dissolved epoxy are then drawn through the portal 48, the bore 46, the tube 20 and portal 18 into the jet pump 12. The used etchant solution 36 and epoxy dissolution products are then carried away by the water flowing through the jet pump 12 and strongly diluted for effective and safe disposal into the drain. The jet of the etchant 36 is self-controlled because removal of the device 26 from about the etch cup 44 restores the atmospheric pressure inside the cup 44. Thus, once the device 26 is removed the level of etchant in the tube 24 immediately drops to that in the breaker 32 and the tube 20 is simultaneously sucked empty. Once the process has commenced, the liquid source at portal 14 can be left running so that full attention can be given to the progress of decapsulation and stopping the process at the correct time simply by removing the device 26 from about the cup 44.

To monitor the progress, a voltage potential is applied between the electrode 40 and the electrical socket 28 by the power supply 43. When the etching process progresses to the point where the bonding wires 56 and the silicon chip 54 embedded in the device 26 are reached, the etchant solution 36 acts as a conductor and current flows between the electrode 40 and the socket 28. The flow of current is recorded by the recorder 42.

FIG. 4 graphically illustrates the current as a function of time as recorded by the recorder 42. After a few seconds, e.g. at time "a," the current increases from zero to "$i_b$," e.g. approximately five mA. This indicated that the decapsulation process has progressed to the point that the silicon chip 54 with its connecting wires embedded in the device 26 has been reached. After a time increment, e.g. approximately five more seconds the silicon chip 54 will be clear of epoxy and the decapsulation process may be halted. Some semiconductor devices have a pin electrically connected to the metal die attach pad of the semiconductor device, in which case there is a small step increase in the current after the decapsulation process has progressed to the point of reaching the pad. This is indicated by the step at time "b" to current "$i_b$" in FIG. 4. The step increase indicates that the decapsulation has progressed to the point that the metal header has been reached indicating that the decapsulation process is completed for exposure of the encapsulated chip 54.

After the etching is completed, the semiconductor device 26 is removed from the socket 28 and dropped into a beaker of isopropanol to cleanse the device 26 of dissolved epoxy and etchant solution. The semiconductor device 26 is then removed from the beaker and spray rinsed with isopropanol for a few seconds and blown dry.

The decapsulation apparatus 10 of the present invention enables the improved decapsulation of the molded semiconductor device 26. The jet etch technique employed in the decapsulation apparatus 10 enables reliable and rapid decapsulation, which is nondestructive of the silicon chip 54 and the bonding wires 56. Moreover, electrical testing after decapsulation is easier because the overall package of the semiconductor device 26 is unimpaired. Different size devices 26 do not require special provisions because, by being secured in position by the underpressure in the cup 44, there is no need for clamps.

In carrying out the decapsulation process of the device 26, frequently it is advisable to slightly grind down the package to reduce the depth of the opening to be etched so that there is less chance of the walls breaking down before the semiconductor chip is reached. Should this happen, the underpressure in the cup 44 would be lost and the procedure interrupted. The grinding down of the package is not critical and there is no need to reach the wires of the device 26. For example one millimeter is recommended for a dual in-line package.

Moisture which could possibly lead to corrosion during decapsulation can be removed from the package by a vacuum bake. The bake may be in the order of one hour at approximately 100° C. The etchant 36 is also kept heated for this same reason. If the etchant is sulfuric acid, it may be kept at the process temperature of approximately 275° C. at least approximately one hour to drive out any dissolved water.

The monitoring circuit may be programmed for the value "$i_a$," e.g. five milliamps by setting the power supply 43 at approximately five volts with the electrode 40 positive relative to the polarity of the device 26.

The packaged device 26 is then taken from the vacuum oven and immediately inserted into the socket 28 and positioned over the cup 44. The recorder 42 is activated and the water source 13 opened. Generally, within a few seconds the current increases from zero to "$i_a$" indicating that the chip has been reached.

After removal of the socket 28 with the device 26 from about the cup 44, the socket lever 30 is operated to release the device 26. The device is then dropped into a supply of isopropanol, the recorder 42 stopped and the supply 13 shut-off. The device 26 is taken from the isopropanol supply, spray rinsed and blown dry.

The result is a very clean chip at the bottom of a small hole in an otherwise unimpaired package.

FIG. 5 illustrates an alternative embodiment of a decapsulation apparatus in accordance with the present invention and referred to by the general reference numeral 58. The decapsulation apparatus 58 includes a jet pump 60 connected to a source of neutral fluid 62 which may comprise either a liquid or gas. The jet pump 60 includes an inlet portal 64, a tapered constriction 66 in the flow path and an elongated extension 68. The extension 68 may extend to a drain or other disposal outlet. A portal 70 is located along the extension 68. The portal 70 has a diameter less than the diameter of a cross-section of the flow path at the point where the portal 70 is located. A tube 72 is connected to the jet pump 60 at the portal 70. The tube 72 is connected to a secondary vessel 74.

The secondary vessel 74 includes a cover 76 and an extension 78. The extension 78 extends from the side of the secondary vessel 74 and is directed generally downward. The secondary vessel 74 contains a secondary reservoir of etchant solution 80. A tube 82 is also connected to the secondary vessel 74. The tubes 72 and 82 extend into the secondary vessel 74 through the cover 76 but do not extend below the level of the etchant solution 80. An air-tight seal exists between the cover 76 and the secondary vessel 74 and between the tubes 72 and 82 and the cover 76.

The tube 82 is connected to an etching block 84 which is similar to the etching block 22 of the previously described embodiment. A tube 86 is connected to the etching block 84 and extends to a primary vessel 88. The primary vessel 88 includes a cover 90 and a primary reservoir of etchant solution 92. The inside of the primary vessel 88 should remain at atmospheric pressure. Extending from the side of the primary vessel 88 is an extension 94 which is directed generally upward. The extension 94 is connected to a check valve 96. The extension 78 is also connected to the check valve 96. Located below the primary vessel 88 is a hot plate 98.

The operation of the decapsulation apparatus 58 is believed to be as follows. The semiconductor device 26 is placed on top of the etching block 84 such that the silicon chip 54 is centered above an etching cup in the etching block 84. The etching cup of the etching block 84 is similar to the etching cup 44 of the etching block 22. The primary reservoir 92 is heated to the proper use-temperature with hot plate 98. The jet pump 12 is activated causing a low pressure zone at the portal 70. This low pressure zone will create a suction which will draw air from the space above the secondary reservoir 80, thus creating another low pressure zone which will draw etchant solution from the primary reservoir 92 through the tube 86 into the etching block 84 and out through the tube 82. The etchant solution drawn through the etching block 84 will spray the semiconductor device 26 in the manner previously described. The etchant solution will be drawn from the primary reservoir 92 until the level drops below the bottom end of the tube 86. At this time atmospheric pressure will be restored to the space above the secondary reservoir 80. When the atmospheric pressure is restored, the check valve 96 will open permitting etchant solution to flow from the secondary reservoir 80 to the primary reservoir 92. As the level of the etchant solution in the primary reservoir 92 rises above the bottom end of the tube 86 the low pressure zone will again be created in the space above the secondary reservoir 80. The low pressure zone created above the secondary reservoir 80 will cause the check valve 96 to close and etchant solution to be drawn from the primary reservoir 92. In this manner, the etchant solution in the primary reservoir 92 will alternately drop below the end of the tube 86 and rise above the end of the tube 86. Thus, the decapsulation apparatus 58 recycles etchant solution and avoids any problems which may arise in disposing of waste etchant solution. The decapsulation apparatus 58 is also advantageous where the etching process will take a long time since the etchant solution in the system will not be used up.

It has been found that the technology most widely used for epoxy-packaged devices is that of a chip with aluminum metalization covered by a protective coating of silicon oxide or nitride and gold wires from exposed contact pads to the lead frame. The epoxy is frequently applied directly to the chip and wires without a protective elastomer die-coat. Frequently, device failures where this technology is used result from corrosion of exposed aluminum on the contact pads. Thus, in decapsulation, it is necessary to make certain that the aluminum has not been attached due to the decapsulation procedure itself. Because aluminum is chemically very active and hot acids are necessary for dissolution of the epoxy, some slight attack may easily occur during decapsulation and lead to erroneous conclusions.

Thus, to prevent corrosion during decapsulation, it is desirable to keep the aluminum within its passive region. As known, aluminum is normally covered by a thin, native, protective oxide layer which insulates the base metal from its environment. If the sealing properties of this passivation layer are lost, the underlying metal may be rapidly attacked in the decapsulation process. Thus, it is desirable to establish and maintain a strong passivation layer.

The stability of the passivation layer on aluminum depends on the temperature, chemical environment and electrical potential of the aluminum. The electrical potential may be externally applied or electrochemical in nature.

The present procedure and apparatus accommodates each of these factors. As to temperature, normally an increase in temperature reduces the passivation layer's sealing properties. At the same time, however, it may lead to chemical reactions which cause the passivation to improve again in a higher temperature range where the rate of passivation layer formation exceeds the rate of attack of the same layer.

As to the chemical environment the addition of a passivator, e.g. sodium-dichromate to the etchant acid tends to strengthen the passivation layer.

Referring to the electrical potential of aluminum, an increased positive potential on the aluminum tends to promote oxidation of the aluminum and depending on the conversion time, leads to the development of a strong passivation layer. However, if the potential exceeds certain positive limits, depending on the temperature and electrolyte, the high electric field may cause local break-down and pitting corrosion.

Thus, a potential range exists for a given chemical environment and temperature in which the passivation layer does protect the underlying aluminum, i.e. the passive region. Below the lower limit, the passivation may vanish or not be formed and above the higher limit, local breakdown results in pitting corrosion.

Thus, with the present invention, the decapsulation may be conducted within the passive region. The method makes it possible to choose from a number of actions to stay within the passive region because it (a) is easy and safe to adapt the temperature; (b) permits use of an externally applied electric bias to keep the aluminum potential within the passive region, in particular, below the potential which is critical for pitting corrosion requiring an imposed current from the electrode 40; and (c) if required, permits the addition of a passivator to the etchant acid.

In practice, it has been found that although at a temperature of approximately 275° C. and an imposed current of approximately five milliamps, the aluminum has not been attacked, temperatures within the range of approximately 220° C. to approximately 300° C. are acceptable. Also, imposed currents within the range of approximately 100 microamps to approximately ten milliamps are acceptable.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A method for decapsulation of semiconductor devices comprising the steps of:
   heating an etchant solution to a predetermined temperature;
   electrically connecting a potential source between the semiconductor device to be decapsulated and the etchant solution;
   subjecting the semiconductor device to be decapsulated to a jet spray of said etchant solution, said jet spray directed towards the area of the chip encapsulated in said semiconductor device to remove encapsulation from said area;
   continuously withdrawing the used solution and removed encapsulation materials from the area of said device;
   detecting current flowing between said etchant solution and said chip;
   waiting a predetermined period of time after detecting a first increase in current; then
   removing said device from the jet spray; and then
   cleansing said semiconductor device of etchant solution.

2. The method for decapsulation of epoxy-packaged semiconductor devices of claim 1, wherein;
   said etchant solution comprises sulfuric acid which is heated to a temperature within the range of approximately 220° C. to approximately 300° C.

3. The method for decapsulation of epoxy-packaged semiconductor devices of claim 2, wherein;

the detected current is within the range of approximately 100 microamps to approximately ten milliamps.

4. The method for decapsulation of epoxy-packaged semiconductor devices of claim 1, wherein;

the step of cleansing said semiconductor device comprises immersing said semiconductor device in liquid isopropanol, spray-rinsing said semiconductor device with isopropanol, and blow drying said semiconductor device.

5. The method for decapsulation of epoxy-packaged semiconductor devices of claim 1, further comprising the step of;

baking said semiconductor device prior to decapsulation.

6. The method for decapsulation of epoxy-packaged semiconductor devices of claim 1, wherein;

a passivator is added to said etchant solution.

7. The method for decapsulation of epoxy-packaged semiconductor devices of claim 6, wherein;

said passivator comprises sodium-dichromate.

8. The method for decapsulation of epoxy-packaged semiconductor devices of claim 1, wherein;

said detected current is aproximately five milliamps.

* * * * *